United States Patent
Yamamoto

(10) Patent No.: US 6,608,358 B1
(45) Date of Patent: Aug. 19, 2003

(54) DUMMY PATTERN FOR IMPROVING MICRO-LENS FORMATION IN AN IMAGE SENSOR

(75) Inventor: Katsumi Yamamoto, Shanghai (CN)

(73) Assignee: Hua Wei Semiconductor (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 10/280,993

(22) Filed: Oct. 25, 2002

(51) Int. Cl.⁷ .......................... H01L 27/14; H01L 31/00
(52) U.S. Cl. ......................................... 257/431; 257/432
(58) Field of Search ................................. 257/431, 432, 257/433, 434, 435, 436, 437, 438, 439, 440, 441, 442, 443, 444, 446, 449, 447, 448, 414

(56) References Cited

U.S. PATENT DOCUMENTS

| | | | |
|---|---|---|---|
| 5,854,125 A | * | 12/1998 | Harvey |
| 6,261,861 B1 | | 7/2001 | Pai et al. |
| 6,274,917 B1 | | 8/2001 | Fan et al. |
| 6,297,071 B1 | | 10/2001 | Wake |
| 6,348,361 B1 | * | 2/2002 | Lee et al. |
| 6,362,513 B2 | | 3/2002 | Wester |
| 6,436,851 B1 | | 8/2002 | Young et al. |
| 6,482,669 B1 | * | 11/2002 | Fan et al. |

* cited by examiner

Primary Examiner—Nathan J. Flynn
Assistant Examiner—Kevin Quinto
(74) Attorney, Agent, or Firm—Perkins Coie LLP

(57) ABSTRACT

An image sensor die formed on a wafer is disclosed. The image sensor die comprises a plurality of pixels formed in a semiconductor substrate, each pixel including a light sensitive element. Further, a dummy pattern is formed on the image sensor die, wherein the dummy pattern comprises ridges of a dummy pattern material that is operative to evenly distribute a micro-lens material over said wafer.

10 Claims, 3 Drawing Sheets

DUMMY PATTERN FOR IMPROVING MICRO-LENS FORMATION IN AN IMAGE SENSOR

TECHNICAL FIELD

The present invention relates to image sensors, and more particularly, towards a structure for improving the formation of micro-lenses in an image sensor.

BACKGROUND

Image sensors are electronic integrated circuits that can be used to produce still or video images. Solid state image sensors can be either of the charge coupled device (CCD) type or the complimentary metal oxide semiconductor (CMOS) type. In either type of image sensor, a light gathering pixel is formed in a substrate and arranged in a two-dimensional array. Modern image sensors typically contain millions of pixels to provide a high resolution image. Important parts of the image sensor are the color filters and micro-lens structures formed atop of the pixels. The color filters, as the name implies, are operative, in conjunction with signal processing, to provide a color image. The micro-lenses serve to focus the incident light onto the pixels, and thus to improve the fill factor of each pixel.

Conventionally, micro-lenses are formed by spin coating a layer of micro-lens material onto a planarized layer. The micro-lens material is then developed to form cylindrical or other shaped regions that are centered above each pixel. Then, the micro-lens material is heated and reflowed to form a hemispherical micro-lens. FIG. 1 shows a prior art cross-sectional simplified diagram of an image sensor 101 having micro-lenses formed thereon. As seen in FIG. 1, the image sensor includes a plurality of pixels that have light detecting elements 103 formed in the substrate. The light detecting elements 103 may be one of several types, such as a photodiode, a photogate, or other solid state light sensitive element. Formed atop of each pixel is a micro-lens 105. The micro-lens 105 focuses incident light onto the light detecting elements 103. Moreover, in the region between the light detecting elements 103 and the micro-lens 105, denoted by reference numeral 107, there are various intervening layers that would typically include the color filter layers and various metal conducting lines.

In the prior art, the color filters are formed by the repetitive deposition and etching of the various color filter layers. Typically, there are three color filter layers that are deposited and etched: red, blue and green layers. Alternatively, cyan, yellow, and magenta layers are used. The process of depositing and etching the color filters will sometimes result in an uneven surface. In other words, the color filter layer is not very planar.

This may cause difficulties in forming consistent high quality micro-lenses across all of the multiple image sensor dies on a single wafer. This is because the micro-lens material is spin coated onto the color filter layers. Due to the non-planar nature of the color filter layers, and other irregularities, it has been found that the spin coated micro-lens material is often not evenly distributed across the entire semiconductor wafer.

For example, if a 300 millimeter wafer is used as the substrate to carry the image sensor die, there may be thousands or even tens of thousands of image sensor dies on the single wafer. It is important to be able to evenly distribute the micro-lens material over each of the image sensor dies in a uniform manner.

DETAILED DESCRIPTION

The present invention relates to a method and apparatus for evenly distributing a spin coating of material, specifically a micro-lens material that will be used to form micro-lenses for image sensors of either the CMOS or CCD type. In the following description, numerous specific details are provided to provide a thorough understanding of the embodiments of the invention. One skilled in the relevant art will recognize, however, that the invention can be practiced without one or more of the specific details, or with other methods, components, etc. In other instances, well-known structures or operations are not shown or described in detail to avoid obscuring aspects of various embodiments of the invention.

Reference throughout the specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout the specification are not necessarily all referring to the same embodiment. Furthermore, the particular features, structures, or characteristics may be combined in any suitable manner in one or more embodiments.

As noted above, the formation of the micro-lenses almost always involves the formation of a thin layer of micro-lens material using spin coating techniques. The spin coating technique involves the dispensing of a liquid material onto a wafer and then rotating the wafer until the liquid material is dispersed into a uniform and generally thin (1–10 microns) layer over the entire wafer surface. The prior art spin coating state of the art is discussed in U.S. Pat. No. 6,436,851 to Young et al.

Nevertheless, because of the irregularities generated in the color filter layers, and because of other irregularities, it has been found that it is difficult to spin coat a micro-lens material evenly and consistently over an entire wafer of image sensor dies.

Figure 1:
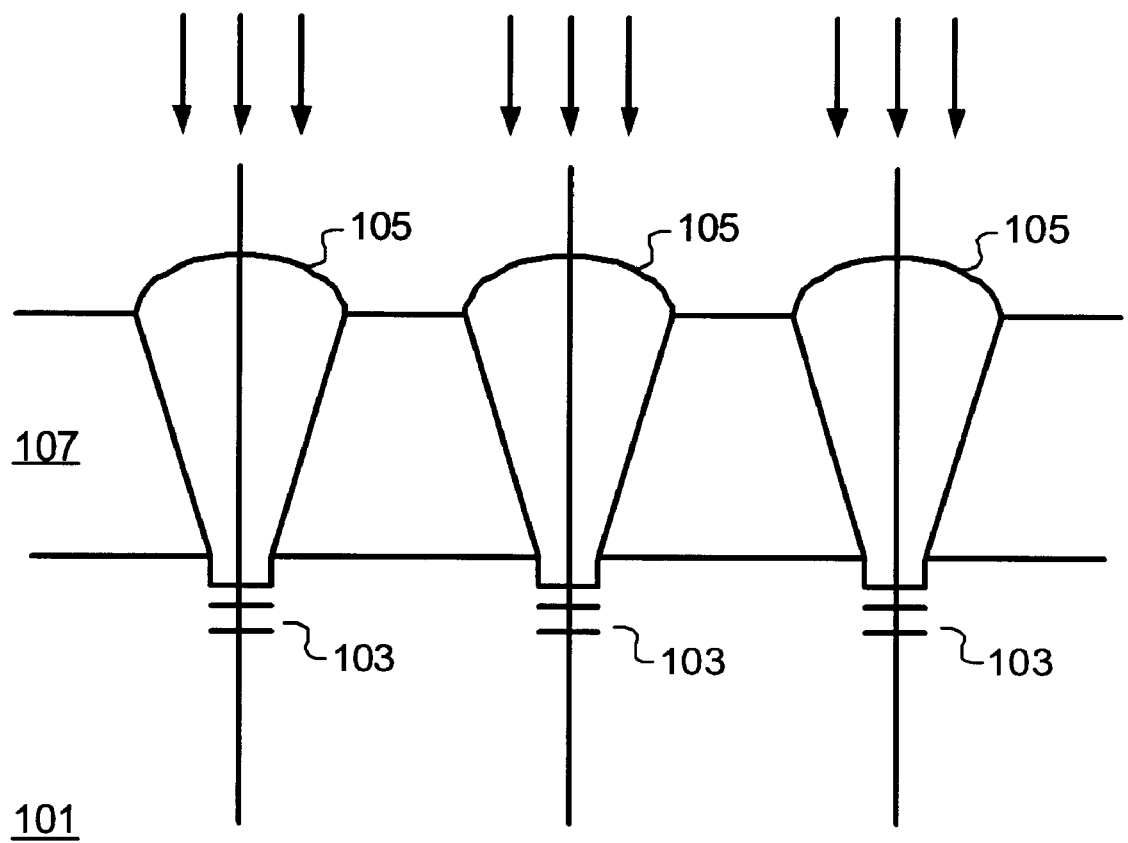
FIG. 1 is a prior art cross sectional view of a portion of an image sensor.
Figure 2:
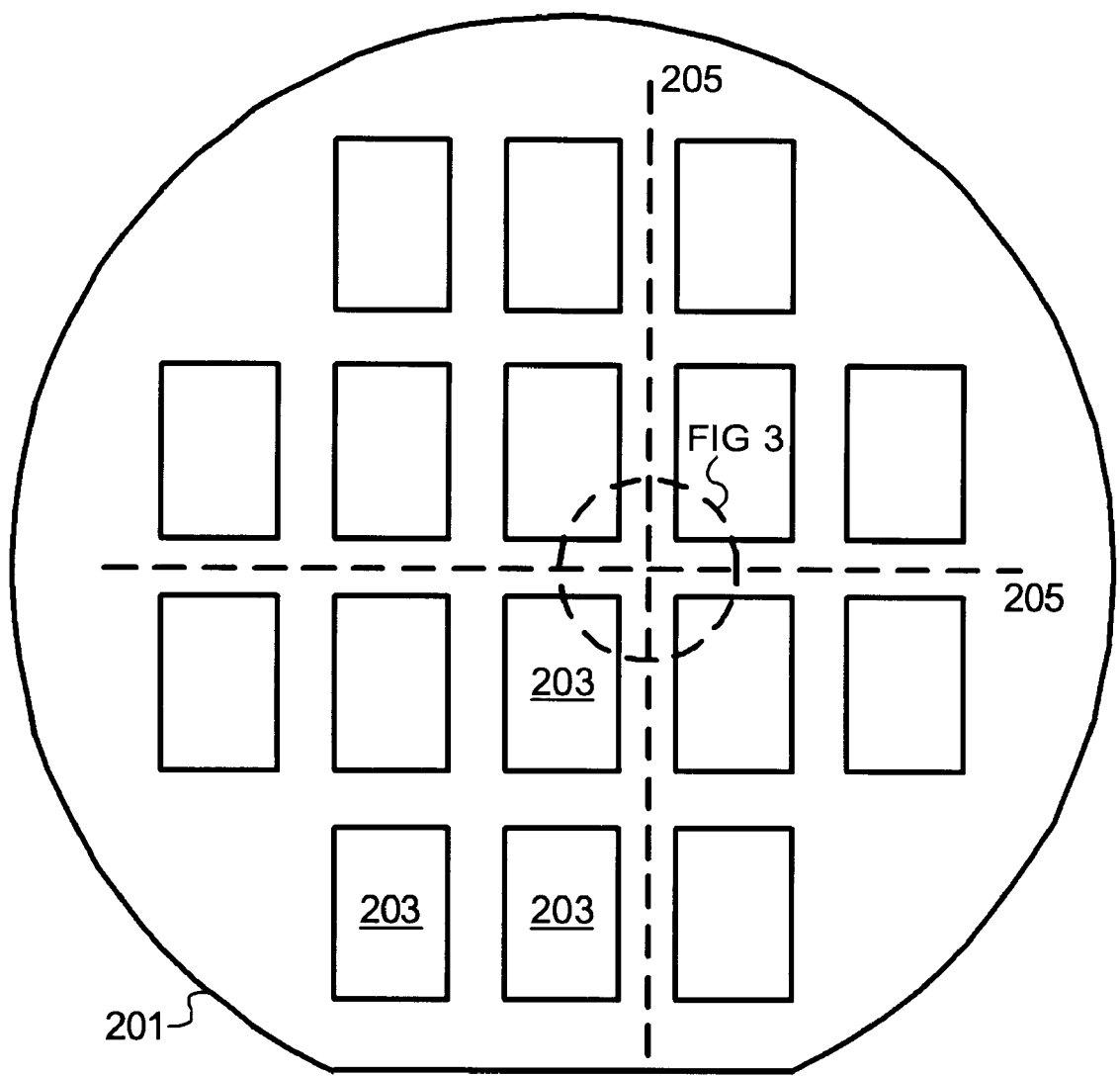
FIG. 2 is a top view of a wafer showing a plurality of image sensors formed thereon.

FIG. 2 shows a top view of a wafer 201 that contains a plurality of image sensor dies 203. There are typically thousands, if not tens of thousands, image sensor dies on a single wafer. Also shown in FIG. 2 are the scribe lines 205 that are between the image sensor dies 203. Only two scribe lines 205 are shown, but it can be appreciated that scribe lines are generally present between each image sensor die. The scribe lines are used in the dicing of the image sensor dies into individual pieces.

Figure 3:
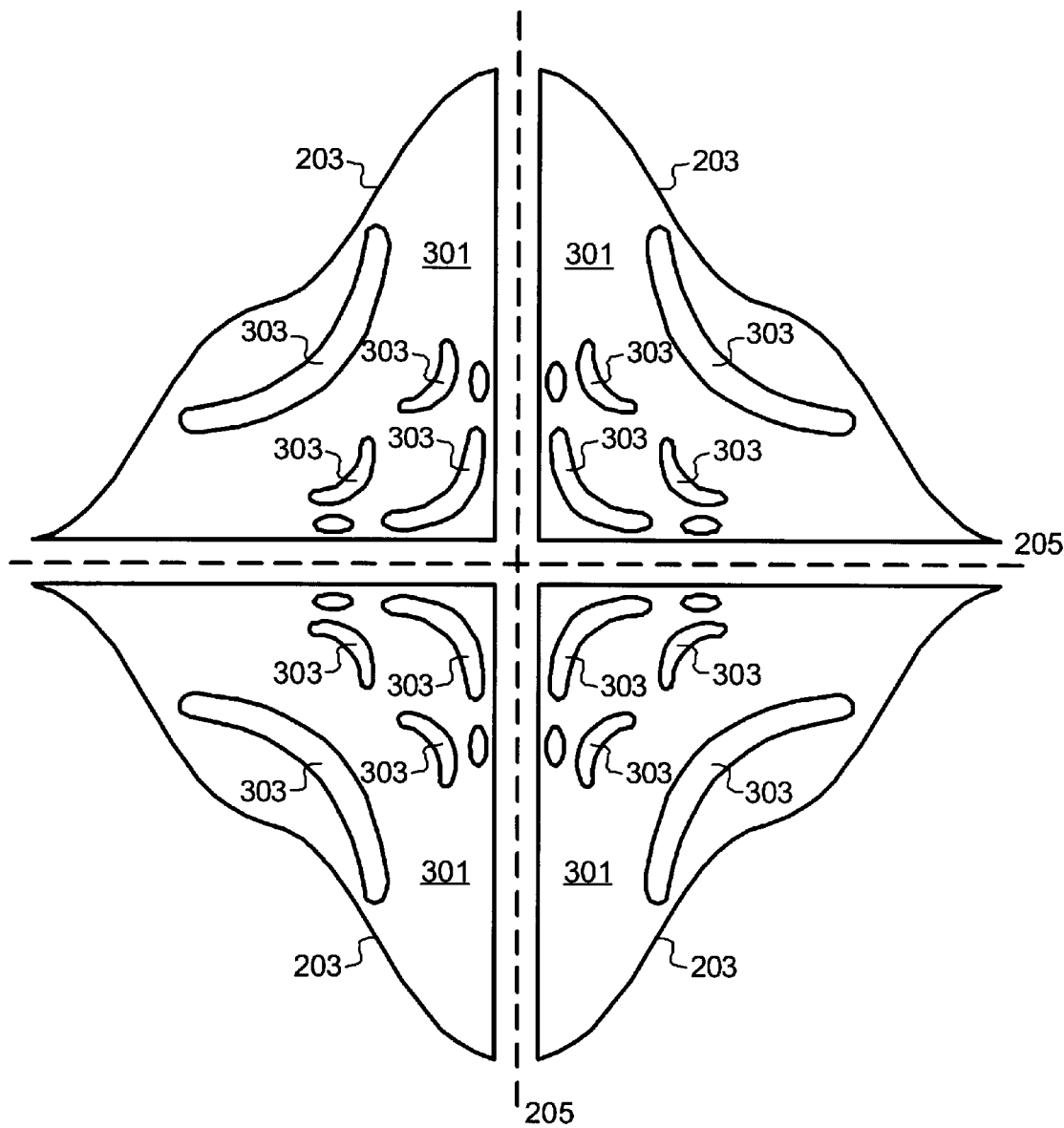
FIG. 3 is a top view of an image sensor having dummy patterns formed thereon in accordance with one embodiment of the present invention.

A section of the wafer 201 is shown in greater detail in FIG. 3. As seen in Figure three, the image sensor dies 203 have a dummy pattern 301 formed thereon, and specifically, at each of the four corners of the image sensor die 203. The purpose of the dummy pattern 301 is to aid in the even distribution of micro-lens material over the entire wafer 201.

The dummy pattern 301 is simply raised portions of material (also referred to as ridges) that are higher than the surrounding topography. One type of pattern is shown in FIG. 3, though it can be appreciated that the dummy pattern 301 may be comprised of a variety of equivalent shapes and sizes. In one embodiment, the dummy pattern 301 is placed at each corner of the image sensor die 203 for ease of fabrication and consistency. Further, the dummy pattern 301 in one embodiment is shaped to be convex relative to the periphery of the image sensor die 203. For example, the dummy pattern 301 is formed from several distinct arcuate segments 303 that are convex to the corner of the image sensor die 203. It has been found that this arcuate shape serves to more evenly distribute flow of the micro-lens material.

The dummy pattern 301 may be formed from nearly any type of material, including the underlying color filter material. Alternatively, it can be made from an interlayer dielectric or a planarizing dielectric. Typically, the interlayer dielectric or the planarizing dielectric is formed from an oxide. It should be noted that the dummy pattern 301 is formed prior to the formation of the micro-lenses. Because of this, depending upon the location of the color filter layers in the stack of layers above the pixels, the dummy pattern 301 may be formed either before or after the color filter layers. In the typical case, the color filter layers are formed atop of the pixels and prior to formation of the micro-lenses. Therefore, it may be advantageous to form the dummy pattern 301 as a part of the color filter layers since there is masking and etching of the various color filter layers. Then, it would be easy to modify the masking and etching steps to include the dummy pattern 301, in which case, the dummy pattern 301 would be formed from the same material as the color filter layers. The dummy pattern in one embodiment would have a height of between 1–20 microns, though other lower or higher dummy patterns would also be suitable.

The formation of color filter layers is known in art and will not be described herein to avoid any unnecessary obscuration with the description of the present invention. For example, U.S. Pat. Nos. 6,297,071, 6,362,513, and 6,271,900 show the current state of the color filter art.

From the foregoing, it will be appreciated that specific embodiments of the invention have been described herein for purposes of illustration, but that various modifications may be made without deviating from the spirit and scope of the invention. For example, there are numerous techniques for forming the dummy patterns. The material and shape of the dummy pattern is variable dependent upon various parameters, such as shape and size of the image sensor die. Accordingly, the invention is not limited except as by the appended claims.

I claim:

1. An image sensor die formed on a wafer, said die comprising:

a plurality of pixels formed in a semiconductor substrate, each pixel including a light sensitive element;

a dummy pattern formed on said die, said dummy pattern comprising ridges of a dummy pattern material and operative to evenly distribute a micro-lens material over said wafer; and a color filter formed over each pixel, said dummy pattern material being the same material as said color filter.

2. The image sensor die of claim 1 wherein said image sensor die is rectangular and said dummy pattern is formed on each corner of said image sensor die.

3. The image sensor die of claim 1 wherein said ridges have a height of 1 to 20 microns.

4. The image sensor die of claim 1 wherein said dummy pattern is under a micro-lens material.

5. An image sensor die formed on a wafer, said die comprising:

a plurality of pixels formed in a semiconductor substrate, each pixel including a light sensitive element; and a dummy pattern formed on said die, said dummy pattern comprising ridges of a dummy pattern material and operative to evenly distribute a micro-lens material over said wafer, said dummy pattern comprising a plurality of arcuate segments that are convex to the exterior of said image sensor die.

6. A semiconductor wafer containing a plurality of image sensor die, said die comprising:

a plurality of pixels formed in a semiconductor substrate, each pixel including a light sensitive element;

a dummy pattern formed on said die, said dummy pattern comprising ridges of a dummy pattern material and operative to evenly distribute a micro-lens material over said wafer; and a color filter formed over each pixel, said dummy pattern material being the same material as said color filter.

7. The wafer of claim 6 wherein said image sensor die are rectangular and said dummy pattern is formed on each corner of said image sensor die.

8. The wafer of claim 6 wherein said die have said ridges with a height of 1 to 20 microns.

9. The wafer of claim 6 wherein said dummy pattern is under a micro-lens material.

10. A semiconductor wafer containing a plurality of image sensor die, said die comprising:

a plurality of pixels formed in a semiconductor substrate, each pixel including a light sensitive element; and a dummy pattern formed on said die, said dummy pattern comprising ridges of a dummy pattern material and operative to evenly distribute a micro-lens material over said wafer, said dummy pattern comprising a plurality of arcuate segments that are convex to the exterior of said image sensor die.

\* \* \* \* \*